United States Patent
Jeong (10) Patent No.: US 8,187,774 B2
(45) Date of Patent: May 29, 2012

(54) MASK FOR EUV LITHOGRAPHY AND METHOD FOR EXPOSURE USING THE SAME

(75) Inventor: Goo Min Jeong, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 156 days.

(21) Appl. No.: 12/650,869

(22) Filed: Dec. 31, 2009

(65) Prior Publication Data

US 2010/0323280 A1    Dec. 23, 2010

(30) Foreign Application Priority Data

Jun. 22, 2009 (KR) .................... 10-2009-0055491

(51) Int. Cl.
*G03F 1/00* (2006.01)

(52) U.S. Cl. .......................................................... 430/5

(58) Field of Classification Search ............. 430/5, 322, 430/323, 943, 394; 378/35
See application file for complete search history.

(56) References Cited

U.S. PATENT DOCUMENTS

| 6,902,851 B1 * | 6/2005 | Babcock et al. ................ 430/5 |
| 2003/0064296 A1 * | 4/2003 | Yan ................................... 430/5 |
| 2008/0032508 A1 | 2/2008 | Chang |
| 2008/0199787 A1 | 8/2008 | Hayashi et al. |

FOREIGN PATENT DOCUMENTS

| KR | 10-2007-0071533 | 7/2007 |
| KR | 10-2007-0071660 | 7/2007 |
| KR | 10-2007-0111203 | 11/2007 |
| KR | 10-2009-0103629 | 10/2009 |

\* cited by examiner

*Primary Examiner* — Stephen Rosasco
(74) *Attorney, Agent, or Firm* — Marshall, Gerstein & Borun LLP (57) ABSTRACT

Disclosed is a mask for an EUV lithography, which includes: a mirror layer which reflects EUV incident on a substrate; an absorber pattern formed on the mirror layer so as to expose a first region and a second region in the mirror layer; and a first groove formed by recessing a third region in the first region of the mirror layer by a first depth and a second groove formed by recessing a fourth region in the second region of the mirror layer by a second depth, which is deeper than the first depth.

9 Claims, 7 Drawing Sheets

MASK FOR EUV LITHOGRAPHY AND METHOD FOR EXPOSURE USING THE SAME

CROSS-REFERENCE TO RELATED APPLICATIONS

The present application claims priority to Korean patent application number 10-2009-0055491, filed on Jun. 22, 2009, which is incorporated by reference in its entirety.

BACKGROUND OF THE INVENTION

The present invention relates to a lithography technology, and more particularly, to a mask for an extreme ultra-violet (EUV) lithography and a method for exposure using the same.

A photo mask functions to form a desired pattern on a wafer while light is irradiated on a mask pattern formed on a substrate of a transparent material and transmitted light is transferred onto the wafer. As a pattern size of a semiconductor device is miniaturized with an increase in integration of the semiconductor device, there is shown a limitation in formation of a mask pattern. Particularly, as the semiconductor device is reduced to 30 nm technology or below, it is difficult to transfer a fine pattern onto the wafer with exposure equipment using an ArF wavelength. In one method for overcoming this limitation, a lithography process using an extreme ultra-violet ray (EUV) has been developed and used.

The EUV lithography process uses EUV light with a wavelength of 13.5 nm, which is shorter than that of KrF or ArF light used in a conventional exposure process. When using the EUV, the EUV is absorbed in most materials and is thus difficult to be used in a current method for exposure using transmission. Accordingly, a method for exposure by reflection of light, not a method for exposure using transmission of light has been studied. A mask used in the EUV lithography is formed including a mirror layer of a multi-layer structure of Mo/Si layers on a substrate. Accordingly, an absorber pattern is formed as a shape of a layout of a pattern to be transferred onto a wafer.

The lithography process using the mask for EUV lithography is expectedly able to exposure-transfer a pattern with a critical dimension of 32 nm onto a wafer at a depth of focus of about 150 nm. Nevertheless, a higher integration degree of a semiconductor device is required, and development of an EUV lithography process capable of obtaining higher resolution will be required if a critical dimension of a circuit pattern integrated on a wafer is reduced to 30 nm or less.

In an example of a method for obtaining a higher resolution in the EUV lithography process, there is a double patterning technology (DPT). The double patterning technology is a method of forming a pattern to be transferred onto a final wafer with a two step exposure processes using two masks. That is, a photolithography process for one layer is implemented using two divided masks, instead of using a single mask. In this case, a database is also divided into two masks. This double patterning technology has a problem that process steps become complex since two masks for a mask pattern, which is divided into two patterns, are fabricated and the exposure process is thus implemented two times. Also, if the mask is fabricated into two sheets, mask registrations occur respectively, resulting in a mask registration error. This mask registration error results in deterioration in overlay of exposure equipment upon the subsequent exposure process. Therefore, there is required a method which improves the mask registration error upon the EUV lithography process and thus can form a precise pattern on a wafer.

SUMMARY OF THE INVENTION

In one embodiment, a mask for an EUV lithography includes: a mirror layer which reflects EUV incident on a substrate; an absorber pattern formed on the mirror layer so as to expose a first region and a second region in the mirror layer; and a first groove formed by recessing a third region in the first region of the mirror layer by a first depth and a second groove formed by recessing a fourth region in the second of the mirror layer by a second depth, which is deeper than the first depth.

Preferably, the first groove is formed to the first depth, in which an amount of a reflected light reflected by 0 degrees and an amount of a reflected light reflected by 180 degrees are equal and thus they are destructed upon incidence of a first wavelength $\lambda 1$, and a reflected light having a phase difference of 180 degrees from a reflected light reflected in the third region is reflected upon incidence of a second wavelength $\lambda 2$.

Preferably, the second groove is formed to the second depth, in which an amount of a reflected light reflected by 0 degrees and an amount of a reflected light reflected by 180 degrees are equal and thus they are destructed upon incidence of a second wavelength $\lambda 2$, and a reflected light having a phase difference of 180 degrees from a reflected light reflected in the fourth region is reflected upon incidence of a first wavelength $\lambda 1$.

Preferably, the mask may further include: a capping layer placed as interface between the mirror layer and the absorber pattern to protect the mirror layer.

In another embodiment, a method for exposure using a mask for an EUV lithography includes: forming a mirror layer which reflects EUV incident on a substrate; forming an absorber pattern, which exposes a first region and a second region in the mirror layer; forming a mask for an EUV lithography by recessing a fourth region in the first region of the mirror layer to form a groove with a first depth having a height difference from a surface of the first region and recessing a third region in the second region of the mirror layer to form a groove with a second depth having a height difference from a surface of the second region; forming a resist pattern which exposes a first portion of a wafer with a first exposure using the mask for an EUV lithography; and forming a resist pattern which exposes a second portion of the wafer other than the first portion with a second exposure using the mask for an EUV lithography.

Preferably, the first groove is formed to the first depth, in which an amount of a reflected light reflected by 0 degrees and an amount of a reflected light reflected by 180 degrees are equal and thus they are destructed upon incidence of a first wavelength $\lambda 1$, and a reflected light having a phase difference of 180 degrees from a reflected light reflected in the fourth region is reflected upon incidence of a second wavelength $\lambda 2$.

Preferably, the second groove is formed to the second depth, in which an amount of a reflected light reflected by 0 degrees and an amount of a reflected light reflected by 180 degrees are equal and thus they are destructed upon incidence of a second wavelength $\lambda 2$, and a reflected light having a phase difference of 180 degrees from a reflected light reflected in the third region is reflected upon incidence of a first wavelength $\lambda 1$.

Preferably, in the first exposure process, an EUV light with a first wavelength is incident to induce a destructive interference in the first region in the mirror layer and induce a constructive interference in the second region in the mirror layer to thereby form the resist pattern which exposes the first portion on the wafer.

Preferably, in the second exposure process, an EUV light with a second wavelength is incident to induce a destructive interference in the second region in the mirror layer and induce a constructive interference in the first region in the mirror layer to thereby form the resist pattern which exposes the second portion on the wafer.

DESCRIPTION OF SPECIFIC EMBODIMENTS

Hereinafter, a method for fabricating a photomask in accordance with the present invention will be described in detail with reference to the accompanying drawings.

FIGS. 1 through 11 illustrate a mask for an EUV lithography and a method for exposure using the same.

Figure 1:
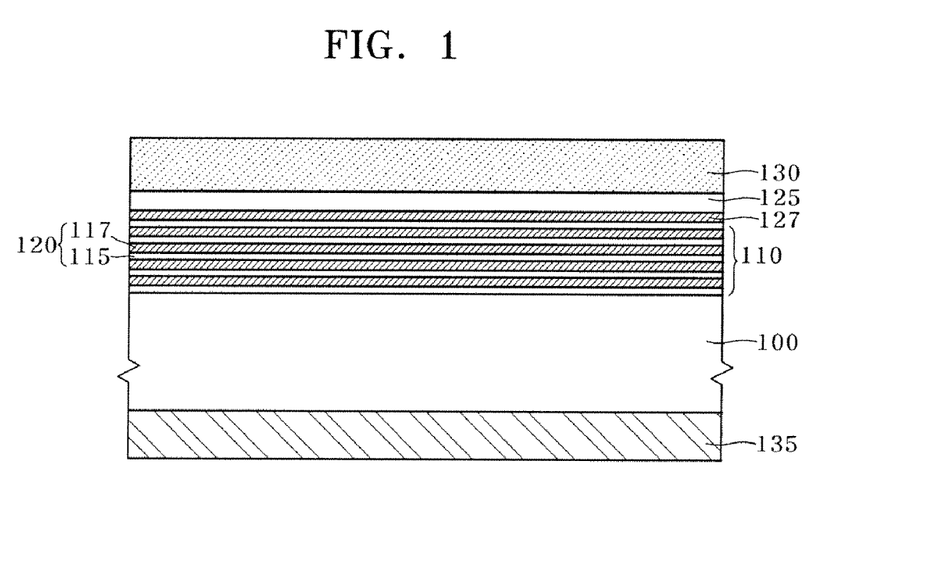
FIGS. 1 through 11 illustrate a mask for an EUV lithography and a method for exposure using the same.

Referring to FIG. 1, a mirror layer 110 is formed on a substrate 100. The substrate 100 is made including a transparent material, e.g. quartz, which can transmit light. On a backside of the substrate, an electrostatic inducing layer 135, which induces adhesion of the substrate by electrostatic action when the substrate 100 is mounted on an electrostatic chuck of EUV lithography equipment, can be formed including a chromium nitride (CrN) layer.

The mirror layer 110 formed on the substrate 100 reflects light irradiated on a mask upon an exposure process to be implemented later. The mirror layer 110 is formed in such a structure that a dual layer 120 including a scattering layer 115 for scattering incident EUV and a spacer layer 117 for spacing between the scattering layers 115 is stacked in plural. Herein, the scattering layer 115 can be formed including a molybdenum (Mo) layer, and the spacer layer 117 can be formed including a silicon (Si) layer. To obtain a high reflectivity, the scattering layer 115 and the spacer layer 117 can be formed in a multilayer structure in which 30 to 60 layers are alternately stacked. In this case, the uppermost layer 127 of the mirror layer 110 functions as a capping layer, which protects the mirror layer 110 from oxidation or contamination during a process of fabricating a mask. The uppermost layer 127 which functions as a capping layer can be formed including silicon (Si) or silicon oxide (SiO2).

Next, a buffer layer 125 and an absorber layer 130 are formed on the mirror layer 110. The buffer layer 125 formed on the mirror layer 110 relieves a stress between the mirror layer 110 and the absorber layer 130. This buffer layer 125 can be formed including chromium nitride (CrN). The absorber layer 130, in correspondence with the mirror layer 110, absorbs and extinguishes an incidence light incident on a mask in an exposure process to be implemented later. This absorber layer 130 in formed including a material having an absorptance of 99.8% to the incident EUV.

Figure 2:
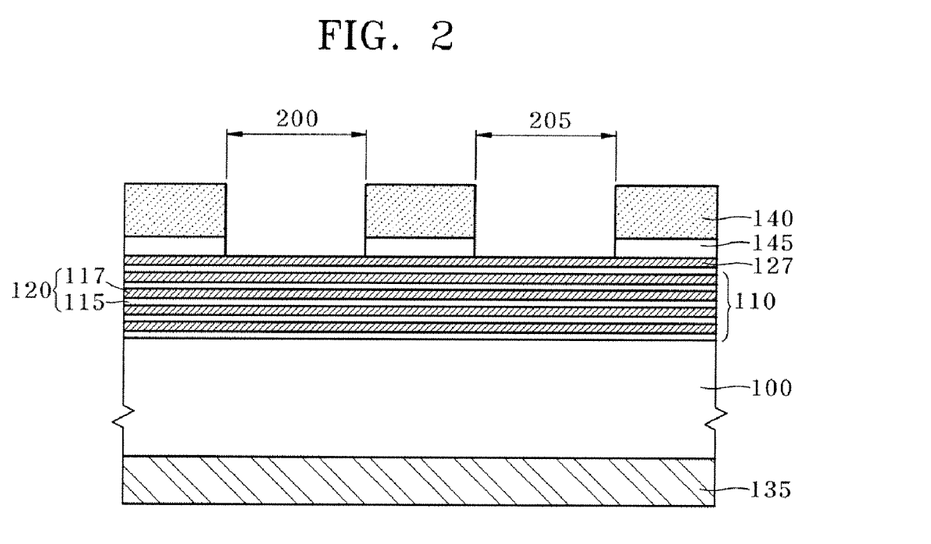

Referring to FIG. 2, an absorber pattern 140 and a buffer layer pattern 145 which selectively expose a surface of the uppermost layer of the mirror layer 110 are formed. Specifically, a resist layer (not shown) is coated on the absorber layer 130 (see FIG. 1) and a lithography process including exposure and development to form a resist pattern which exposes some portion of a surface of the absorber layer 130. Next, the absorber layer 130 and the buffer layer 125 are etched using the resist pattern as an etch mask to form the absorber pattern 140 and the buffer layer pattern 145 which expose some portion of the surface of the uppermost layer of the mirror layer 110. By absorber pattern 140 and the buffer layer pattern 145, a first region 200 and a second region 205 in the mirror layer 110 are selectively exposed. Herein, the first region 200 and the second region 205 are formed having the same width.

Figure 3:
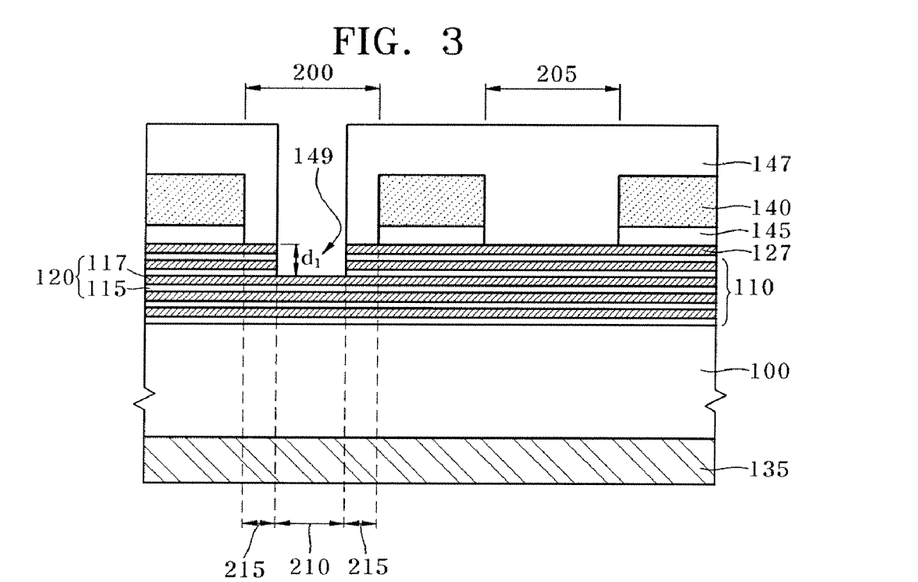

Referring to FIG. 3, a first resist pattern 147 which covers the absorber pattern 140 is formed. Specifically, a resist layer is coated on the substrate 100. Next, a lithography process including exposure and development is implemented on the resist layer to form the first resist pattern. The first resist pattern 147 is formed so as to expose a third region, a middle portion of the first region 200 in the mirror layer 110 exposed by the absorber pattern 140 and cover a fourth region 215, an edge portion of the first region 200. Also, the first resist pattern 147 is formed so as to cover all of the second region 205, in which the mirror layer 110 is exposed.

Successively, the third region 210 in the first region 200 of the exposed mirror layer 110 is etched using the first resist pattern 147 to form a groove 149 with a first depth d1. Herein, the groove 149 with the first depth d1 is formed by etching by such a depth that a destructive interference occurs by a first wavelength λ1 upon subsequent EUV exposure. That is, d1 optically satisfies 2d1=A*(λ1/2), wherein A is an odd number. In this case, the first depth d1 of the groove 149 is a depth, in which a constructive interference occurs by a wavelength other than the first wavelength λ1, e.g. a second wavelength λ2.

Accordingly, the groove 149 with the first depth d1 comes to have, due to its depth, a height difference from a surface of the fourth region 215 in the mirror layer 110. In this case, the second region 205 in the mirror layer 110 is not influenced by an etch since it is covered with the first resist pattern 147. Next, the first resist pattern 147 is selectively stripped.

Figure 4:
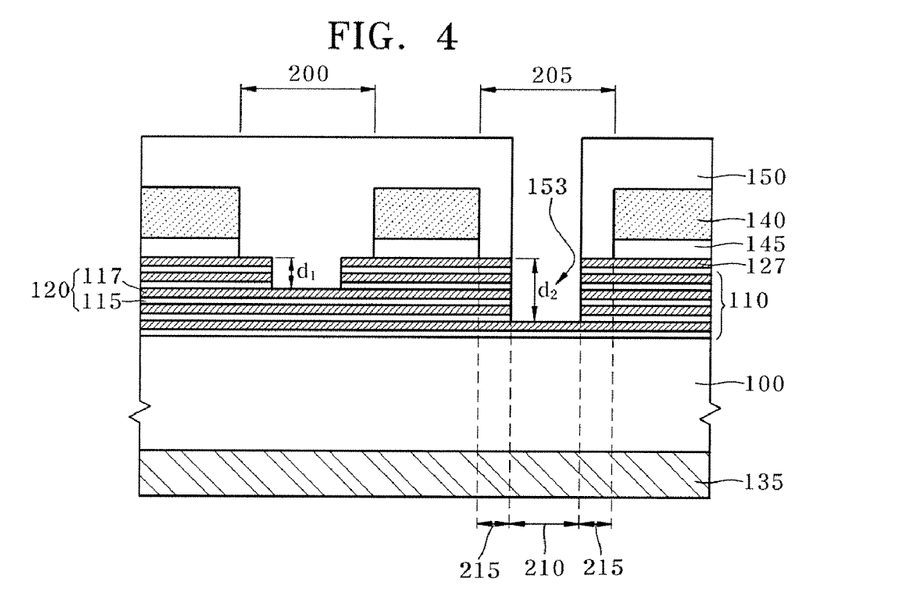

Referring to FIG. 4, a second resist pattern 150 which covers the absorber pattern 140 is formed. The second resist pattern 150 is formed by coating a resist layer on the substrate 100 and then implementing a lithography process including exposure and development. The first resist pattern 150 is formed so as to expose the third region 210, a middle portion of the second region 205 in the mirror layer 110 exposed by the absorber pattern 140, and cover the fourth region 215, an edge portion of the second region 205. Also, the second resist pattern 150 is formed so as to cover all of the first region 200, in which the mirror layer 110 is exposed.

Figure 5:
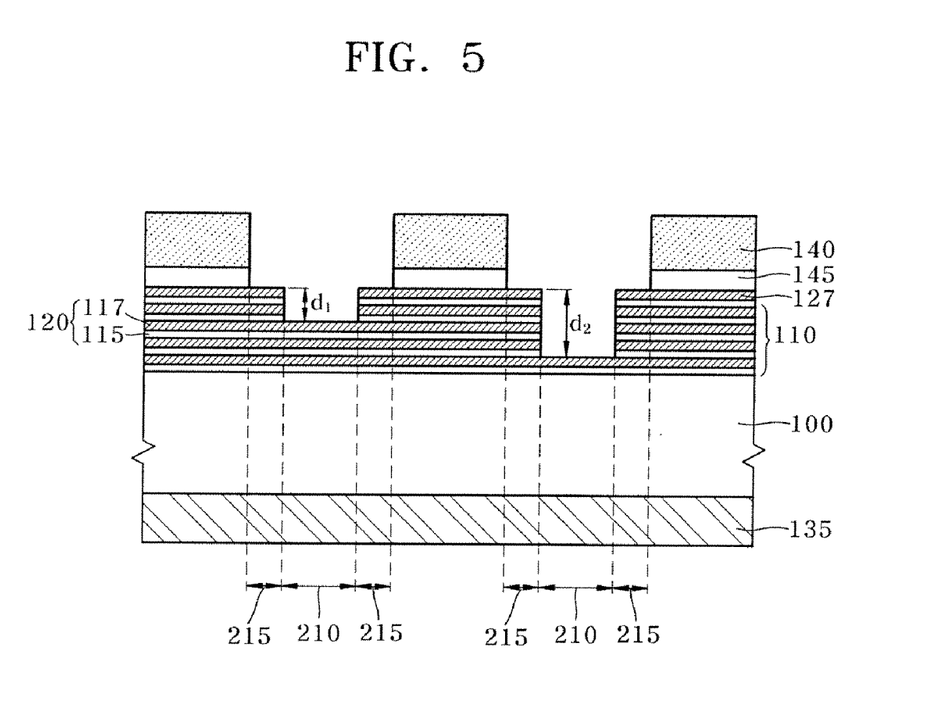

Successively, the third region 210 in the first region 200 of the exposed mirror layer 110 is etched using the second resist pattern 150 to form a groove 153 with a second depth d2. Herein, the groove 153 with the second depth d2 is formed by etching to such a depth that a destructive interference occurs by a second wavelength λ2 upon the subsequent EUV exposure. That is, d2 optically satisfies 2d2=A*(λ2/2), wherein A is an odd number. The groove 153 with the second depth d2 comes to have, due to its depth, a height difference from a surface of the fourth region 215 in the mirror layer 110. Herein, the groove 153 with the second depth d2 is relatively deeper than the groove 149 with the first depth d1. In this case, the second depth d2 of the groove 153 is a depth, in which a constructive interference occurs by a wavelength other than the second wavelength λ2, e.g. a first wavelength λ1. In this case, the first region 200 in the mirror layer 110 is not influenced by an etch since it is covered with the second resist pattern 150. Next, the second resist pattern 150 is selectively stripped to form a mask structure for EUV lithography as illustrated in FIG. 5.

Meanwhile, it is possible to form the grooves in the mirror layer using a single resist pattern. Specifically, referring to FIG. 10, a third resist pattern 300 which covers the absorber pattern 140 is formed. The third resist pattern 300 is formed by coating a resist layer on the substrate 100 and then implementing a lithography process including exposure and development. Herein, the third resist pattern 300 is formed so as to expose the third region 210, a middle portion of the second region 205 in the mirror layer 110 exposed by the absorber pattern 140, and cover the fourth region 215, an edge portion of the second region 205. Also, the third resist pattern 300 is formed so as to cover all of the first region 200, in which the mirror layer 110 is exposed. Successively, the third region 210 of the exposed mirror layer 110 is etched using the third resist pattern 300 to form a groove 305 with a third depth d3.

Figure 11:
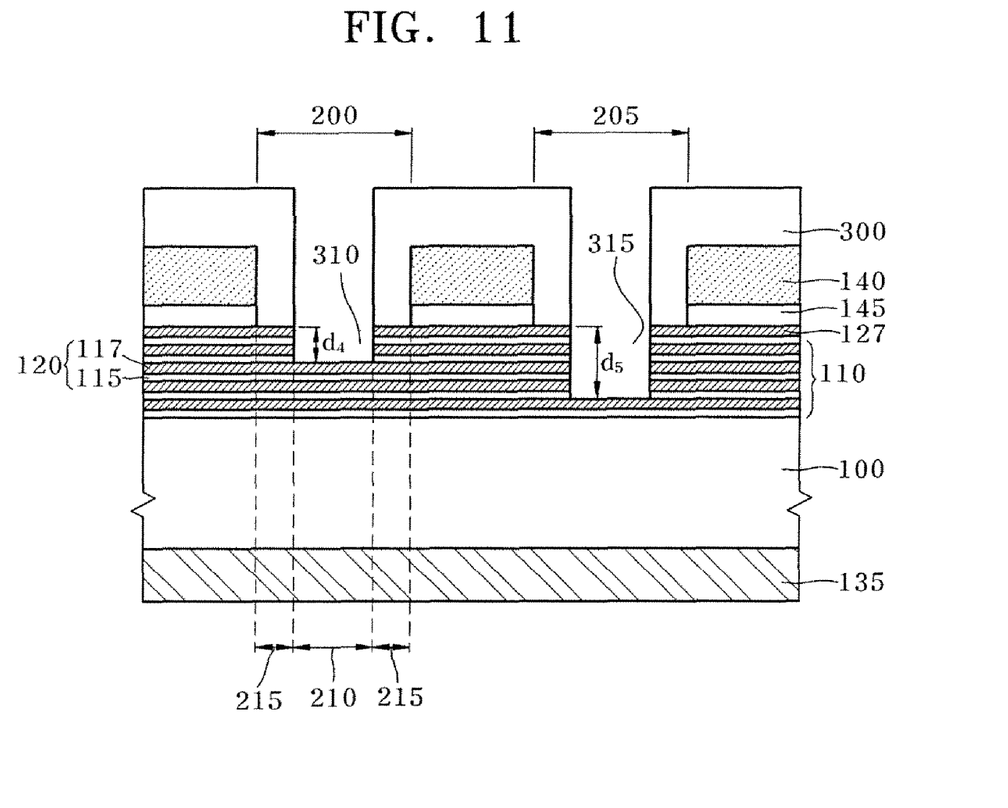

Next, as illustrated in FIG. 11, a lithography process on the first region 200 of the third resist pattern 300 is implemented with the groove 305 with the third depth d3 being exposed to expose the third region 210, a middle portion in the first region 200 of the mirror layer 110. Successively, the third region 210 in the first region 200 of the exposed mirror layer 110 is etched using the third resist pattern 300 to form a groove 310 with a fourth depth d4. In this case, the groove 305 with the third depth d3 in the second region 205 is etched together during the etch of the third region 210 and a groove 315 with a fifth depth d5 relatively deeper than the groove 310 with a fourth depth d4.

Figure 6:
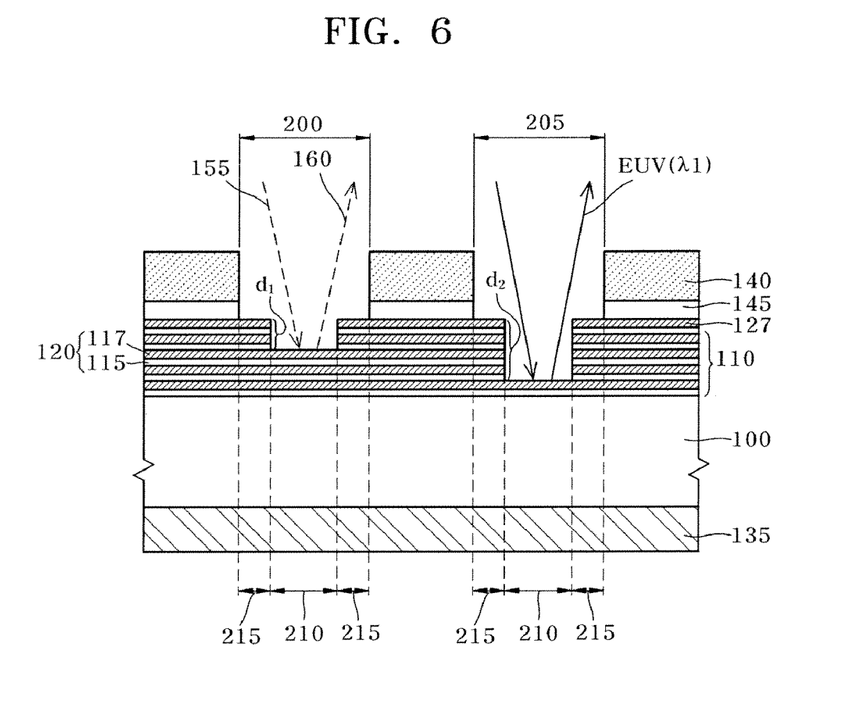
Figure 7:
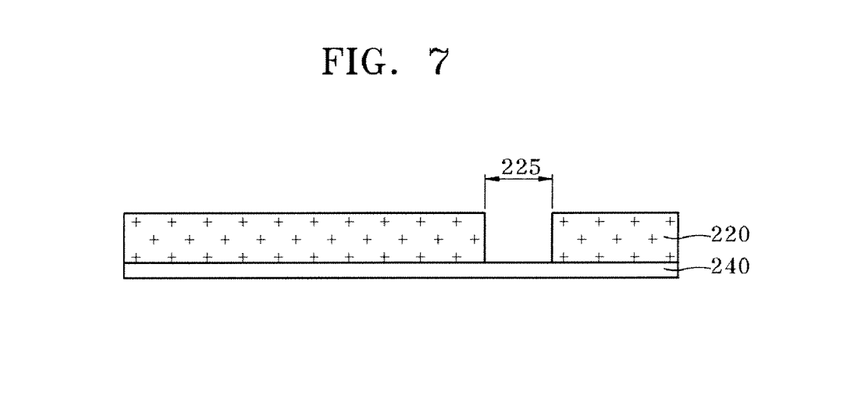

Referring to FIGS. 6 and 7, a first exposure process using a mask for EUV lithography is implemented to form a resist pattern 220 which exposes a first portion 225 on a wafer 240. To this end, a resist layer is first coated on the wafer in FIG. 7. Next, the mask for EUV lithography in FIG. 5 is placed on the wafer 200, and EUV light with a first wavelength λ1 is irradiated thereon.

When the EUV light with the first wavelength λ1 is irradiated on the EUV lithography mask, the EUV light is not reflected in the third region 210 in the first region 200 etched by the first depth d1, in which a destructive interference occurs, as illustrated in FIG. 6. And, reflection of the EUV light occurs in the third region 210 in the second region 205. In this case, the first portion 225 of the resist layer on the wafer is exposed by reflecting a reflected light having a phase difference of 180 degrees from the reflected light reflected in the third region 210 in the second region 205.

Then, in the rest region except for the first portion 225 on the wafer 200, an image contrast which exposes the resist layer is formed below a critical point where the pattern is formed, and thus the exposure is not made. In the rest region, except for the first portion 225 on the wafer 240, an amount of EUV light 155 reflected by 0 degrees and an amount of EUV light 160 reflected by 180 degrees become equal, that is, reflection areas become equal, and thus a pattern image disappears. Next, the exposed portion of the resist layer is removed using a developing solution to form the resist pattern 220 illustrated in FIG. 7.

Figure 8:
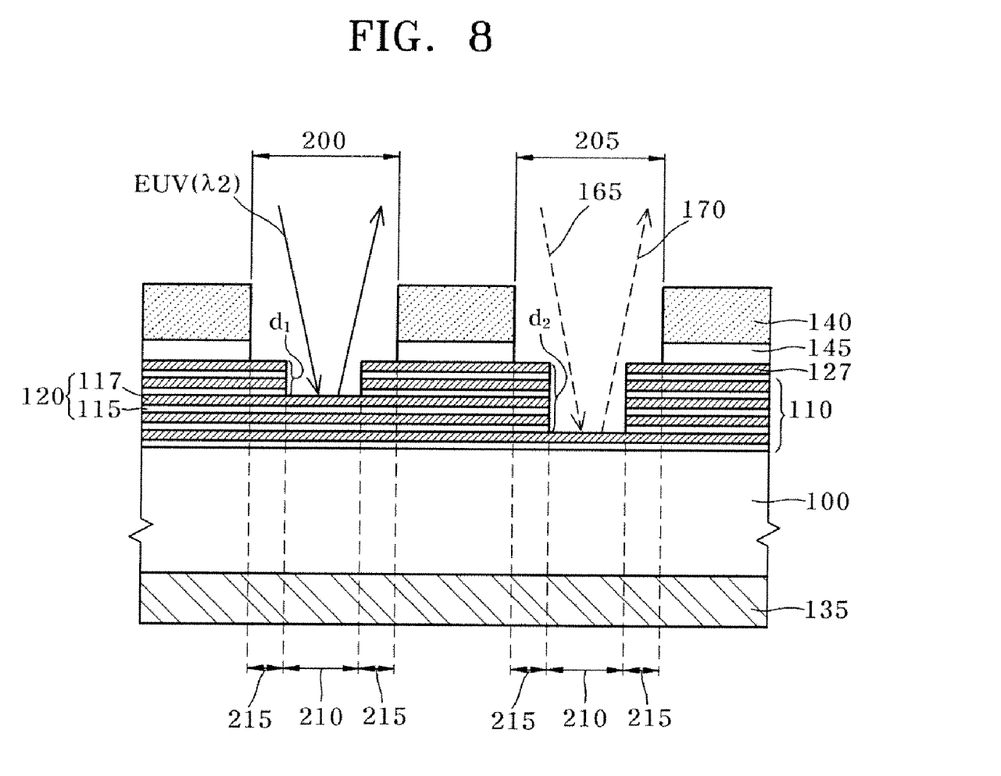
Figure 9:
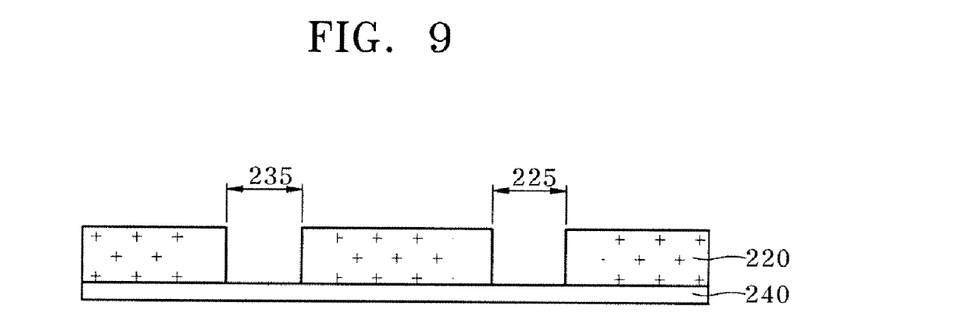
Figure 10:
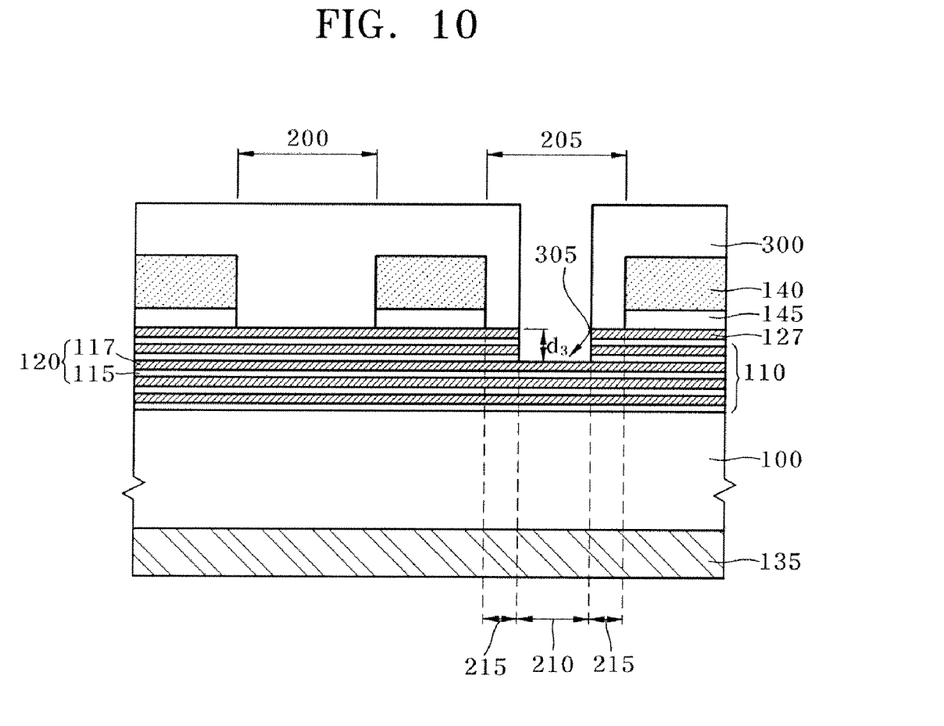

Referring to FIGS. 8 and 9, a second exposure process using a mask for EUV lithography in FIG. 5 is implemented to form the resist pattern 220 which exposes a second portion 235 on a wafer 240. To this end, the mask for EUV lithography in FIG. 5 is first placed on the wafer 240, and EUV light with a second wavelength λ2 is irradiated thereon.

When the EUV light with the second wavelength λ2 is irradiated on the EUV lithography mask, the EUV light is not reflected in the third region 210 in the second region 205 etched by the second depth d2, in which a destructive interference occurs, as illustrated in FIG. 8. And, reflection of the EUV light occurs in the third region 210 in the first region 200. In this case, the second portion 235 of the photoresist layer on the wafer 240 except for the first portion 225 is exposed by reflecting a reflected light having a phase difference of 180 degrees from the reflected light reflected in the third region 210 in the first region 200.

Then, in the rest region except for the second portion 235 on the wafer 240, an image contrast which exposes the photoresist layer is formed below the critical point where the pattern is formed, and thus the exposure is not made. Accordingly, the first portion 225 of the wafer 240 is not influenced by the second exposure process. In the rest region except for the second portion 235 on the wafer 240, an amount of EUV light 165 reflected by 0 degrees and an amount of EUV light 170 reflected by 180 degrees become equal, that is, reflection areas become equal, and thus a pattern image disappears.

And, reflection of the EUV light occurs in the third region 210 in the second region 205 to expose the portion of the photoresist layer corresponding to the second region on the wafer 240. Next, the exposed portion of the photoresist layer is removed using a developing solution to form the resist pattern 220 illustrated in FIG. 8.

In accordance with the present invention, it is possible to obtain the same result as the double patterning technology using two masks, with a single mask by fabricating the resist pattern 220 including the first portion 225 and the second portion 235 on the wafer 2000 with continuous processes. Therefore, it is possible to prevent a mask registration error caused by implementation of exposure with two masks.

While the present invention has been described with respect to the specific embodiments, it will be apparent to those skilled in the art that various changes and modifications may be made without departing from the spirit and scope of the invention as defined in the following claims.

What is claimed is:

1. A mask for extreme ultra violet (EUV) lithography, comprising:
   a mirror layer that reflects EUV light incident on a substrate;
   an absorber pattern formed on the mirror layer to expose a first region and a second region in the mirror layer;
   a first groove formed by recessing a third region in the first region of the mirror layer by a first depth and a second groove formed by recessing a fourth region in the second region of the mirror layer by a second depth, which is deeper than the first depth whereby the first groove has a step with a surface of an exposed-edge portion of the first region, wherein the third region has a narrower width than the first region; and
   a second groove formed by recessing a fourth region in the second region of the mirror layer by a second depth whereby the second groove has a step with a surface of an exposed-edge portion of the second region, wherein the second groove is deeper than the first depth and the fourth region has a narrower width than the second region.

2. The mask of claim 1, wherein the first groove is formed to the first depth, in which an amount of a reflected light reflected by 0 degrees and an amount of a reflected light reflected by 180 degrees are equal and thus they are destructed upon incidence of a first wavelength λ1, and a reflected light having a phase difference of 180 degrees from a reflected light reflected in the third region is reflected upon incidence of a second wavelength λ2.

3. The mask of claim 1, wherein the second groove is formed to the second depth, in which an amount of a reflected light reflected by 0 degrees and an amount of a reflected light reflected by 180 degrees are equal and thus they are destructed upon incidence of a second wavelength λ2, and a reflected light having a phase difference of 180 degrees from a reflected light reflected in the fourth region is reflected upon incidence of a first wavelength λ1.

4. The method of claim 1, further comprising: a capping layer placed as interface between the mirror layer and the absorber pattern to protect the mirror layer.

5. A method for exposure using a mask for an EUV lithography, comprising:

forming a mirror layer that reflects EUV light incident on a substrate;

forming an absorber pattern, which exposes a first region and a second region in the mirror layer;

forming a mask for EUV lithography by recessing a third region in the first region of the mirror layer to form a first groove with a first depth having a height difference from a surface of an edge portion of the first region and recessing a fourth region in the second region of the mirror layer to form a second groove with a second depth having a height difference from a surface of an edge portion of the second region, wherein the third region has a narrower width than the first region and the fourth region has a narrower width than the second region;

forming a resist pattern that exposes a first portion of a wafer with a first exposure using the mask for an EUV lithography;

forming a resist pattern that exposes a second portion of the wafer other than the first portion with a second exposure using the mask for an EUV lithography.

6. The method of claim 5, wherein the first groove is formed to the first depth, in which an amount of a reflected light reflected by 0 degrees and an amount of a reflected light reflected by 180 degrees are equal and thus they are destructed upon incidence of a first wavelength λ1, and a reflected light having a phase difference of 180 degrees from a reflected light reflected in the third region is reflected upon incidence of a second wavelength λ2.

7. The method of claim 5, wherein the second groove is formed to the second depth, in which an amount of a reflected light reflected by 0 degrees and an amount of a reflected light reflected by 180 degrees are equal and thus they are destructed upon incidence of a second wavelength λ2, and a reflected light having a phase difference of 180 degrees from a reflected light reflected in the fourth region is reflected upon incidence of a first wavelength λ1.

8. The method of claim 5, wherein in the first exposure process, an EUV light with a first wavelength is incident to induce a destructive interference in the first region in the mirror layer and induce a constructive interference in the second region in the mirror layer to thereby form the resist pattern which exposes the first portion on the wafer.

9. The method of claim 5, wherein in the second exposure process, an EUV light with a second wavelength is incident to induce a destructive interference in the second region in the mirror layer and induce a constructive interference in the first region in the mirror layer to thereby form the resist pattern which exposes the second portion on the wafer.

* * * * *